(12) United States Patent  
Yoo

(10) Patent No.: US 9,768,176 B2  
(45) Date of Patent: Sep. 19, 2017

(54) SEMICONDUCTOR DEVICE AND METHOD FOR FORMING THE SAME

(71) Applicant: SK hynix Inc., Icheon (KR)

(72) Inventor: Min Soo Yoo, Yongin (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 15/147,841

(22) Filed: May 5, 2016

(65) Prior Publication Data

US 2016/0268262 A1 Sep. 15, 2016

Related U.S. Application Data

(62) Division of application No. 14/165,454, filed on Jan. 27, 2014, now Pat. No. 9,368,399.

(30) Foreign Application Priority Data

Jul. 11, 2013 (KR) ........................ 10-2013-0081613

(51) Int. Cl.
*H01L 27/108* (2006.01)
*H01L 21/768* (2006.01)
*H01L 29/45* (2006.01)

(52) U.S. Cl.
CPC .... *H01L 27/10888* (2013.01); *H01L 21/7685* (2013.01); *H01L 27/10876* (2013.01); *H01L 27/10885* (2013.01); *H01L 27/10894* (2013.01); *H01L 29/456* (2013.01)

(58) Field of Classification Search
CPC ......... H01L 27/10888; H01L 27/10885; H01L 21/7685; H01L 2924/1436
See application file for complete search history.

(56) References Cited

U.S. PATENT DOCUMENTS

| 6,187,624 B1 | 2/2001 | Huang | |
|---|---|---|---|
| 6,602,749 B2 | 8/2003 | Tu et al. | |
| 2002/0045305 A1* | 4/2002 | Lee | ........................ H01L 27/105 438/210 |
| 2008/0003866 A1* | 1/2008 | Bae | ................... H01L 21/76805 439/417 |
| 2009/0072328 A1* | 3/2009 | Son | ................... H01L 27/10876 257/411 |
| 2011/0121386 A1* | 5/2011 | Hsieh | ................ H01L 27/11519 257/334 |
| 2012/0025314 A1 | 2/2012 | Kim | |
| 2012/0153363 A1* | 6/2012 | Shin | ................. H01L 27/10876 257/288 |
| 2013/0049091 A1* | 2/2013 | Saino | .............. H01L 21/823842 257/310 |

(Continued)

FOREIGN PATENT DOCUMENTS

| KR | 10-2007-0003339 A | 1/2007 |
|---|---|---|
| KR | 10-2011-0109725 A | 10/2011 |
| KR | 10-2012-0012592 A | 2/2012 |

*Primary Examiner* — Moazzam Hossain

(57) ABSTRACT

A semiconductor device includes a semiconductor substrate including an active region defined by a device isolation film; a gate electrode filled in the active region; a bit line contact structure coupled to an active region between the gate electrodes; and a line-type bit line electrode formed over the bitline contact structure. The bit line contact structure includes a bit line contact formed over the active region; and an ohmic contact layer formed over the bit line contact.

15 Claims, 24 Drawing Sheets

(56) References Cited

U.S. PATENT DOCUMENTS

2013/0344666 A1* 12/2013 Moon ............... H01L 27/10823
  438/259
2014/0117442 A1* 5/2014 Lee ................. H01L 21/823456
  257/334

* cited by examiner

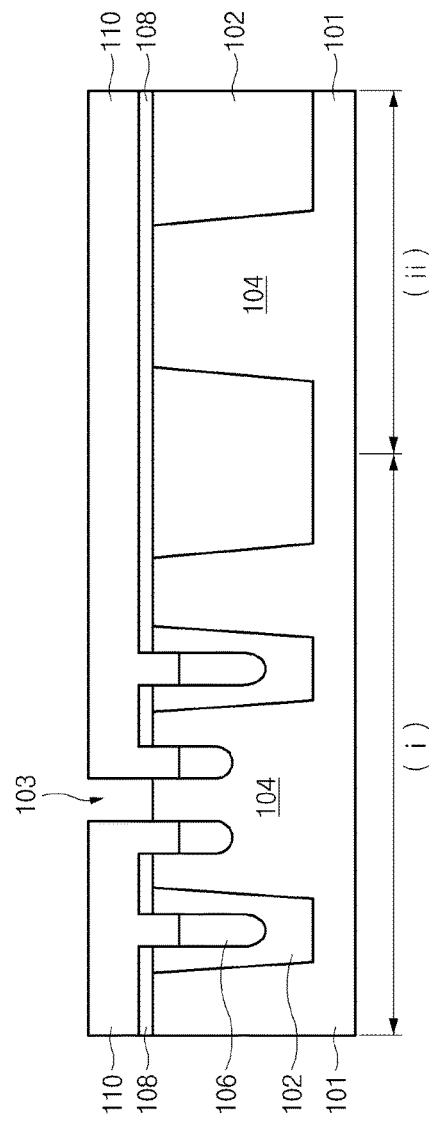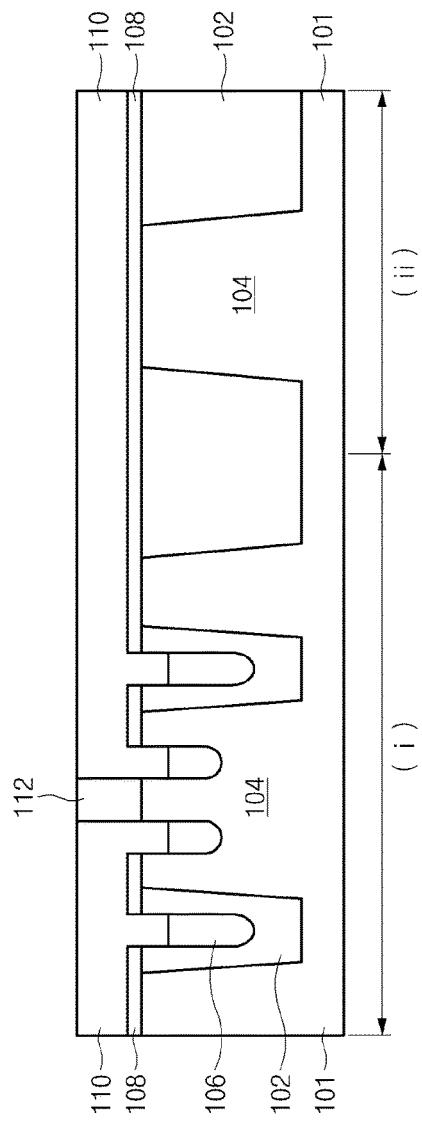

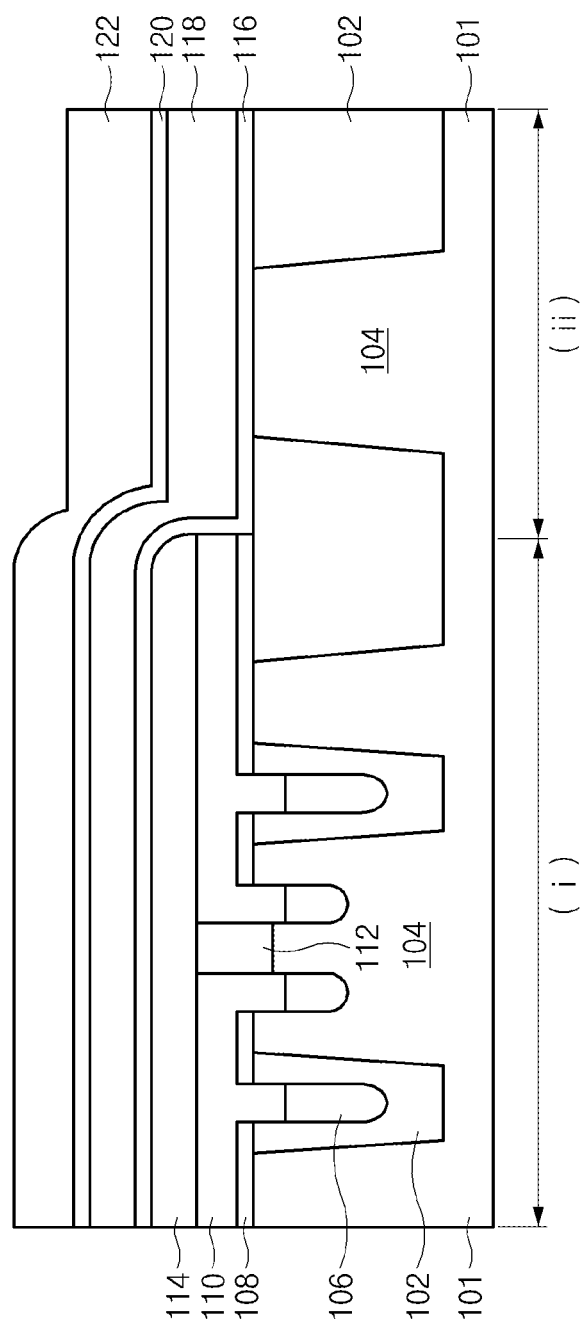

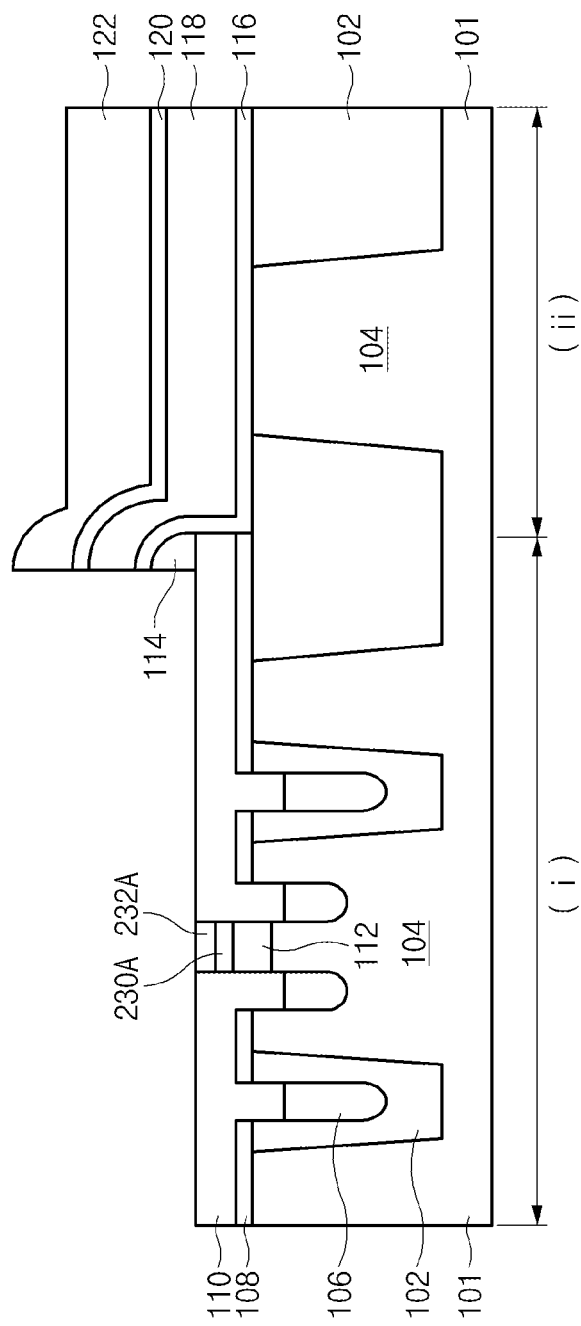

SEMICONDUCTOR DEVICE AND METHOD FOR FORMING THE SAME

CROSS-REFERENCE TO RELATED APPLICATION

The present application is a divisional of U.S. patent application Ser. No. 14/165,454 filed on Jan. 27, 2014, which claims the priority of Korean patent application No. 10-2013-0081613 filed on 11 Jul. 2013, the disclosures of which are hereby incorporated by reference in their entireties.

BACKGROUND

Embodiments relate to a semiconductor device and a method for forming the same, and more particularly to a semiconductor device for reducing bit line parasitic capacitance, and a method for forming the same.

As a design rule is reduced to 100 nm or less to increase the integration degree of the semiconductor memory device, a unit cell size of the semiconductor memory device is reduced, which can cause various issues to arise. For example, a channel length of the transistor is shortened so that a short channel effect such as a punch-through occurs. When a contact is formed, an alignment error is increased so that contact resistance is also increased. As spacing between neighbor constituent elements is gradually reduced, it is difficult to electrically insulate among the constituent elements, and electrical interference caused by parasitic capacitance and the like is increased, so that operation stability and reliability of the semiconductor memory device are reduced.

SUMMARY

Various embodiments are directed to providing a semiconductor device and a method for forming the same that substantially obviate one or more problems due to limitations and disadvantages of the related art.

An embodiment relates to a semiconductor device for minimizing bit line parasitic capacitance while simultaneously maintaining low contact interfacial resistance, and a method for forming the same.

In accordance with an aspect of the embodiment, a semiconductor substrate including an active region defined by a device isolation film; a buried gate electrode formed in the active region; a bit line contact structure coupled to the active region between the buried gate electrode and a neighboring buried gate electrode; and a line-type bit line electrode formed over the bit line contact structure, wherein the bit line contact structure includes: a bit line contact formed over the active region, and an ohmic contact layer formed over the bit line contact.

The bit line contact structure further includes a barrier film formed over the ohmic contact layer.

The semiconductor device further includes line-type barrier film formed between the ohmic contact layer and the bit line electrode.

The ohmic contact layer includes a cobalt silicide CoSix layer, where x is an integer.

The barrier film includes a titanium (Ti) film, a titanium nitride (TiN) film, or a stacked structure (Ti/TiN) of the titanium (Ti) film and the titanium nitride (TiN) film.

A recess is formed in the bit line contact, and the barrier film is formed in the recess.

The bit line electrode is formed in a cell region; the bit line electrode and a gate electrode in a peripheral region are formed substantially at the same time.

The ohmic contact layer is formed only over the bit line contact.

The barrier film is formed only over the bit line contact.

The ohmic contact layer further includes a capping film deposited over the cobalt (Co) film.

In accordance with another aspect of the embodiment, a method for forming a gate in a semiconductor substrate of a cell region including an active region defined by a device isolation film; forming a bit line contact structure over the semiconductor substrate in an active region and between the gate and a neighboring gate, wherein the bit line contact structure includes a stack of a bit line contact and an ohmic contact layer; and forming a bit line electrode over the bit line contact structure.

The bit line electrode is formed in the cell region; and the bit line electrode and a gate electrode in a peripheral region are formed in a same processing step.

The forming the bit line contact structure includes: forming a conductive material and a barrier film over the bit line contact in the cell region and over the semiconductor substrate in a peripheral region; and removing the conductive material and a barrier film in the cell region to expose the bit line contact, and forming an ohmic contact layer over the bit line contact.

The depositing the conductive material and the barrier film includes forming an insulation film over the bit line contact in the cell region and over the semiconductor substrate in the peripheral region; exposing a semiconductor substrate in the peripheral region by etching the insulation film in the peripheral region using a mask configured to open the peripheral region; and stacking the conductive material and the barrier film over the semiconductor substrate in the peripheral region and over the insulation film in the cell region.

The forming the ohmic contact layer includes exposing the bit line contact by removing the conductive material, the barrier film, and the insulation film in the cell region using a mask configured to open the cell region; forming a stack structure including a cobalt (Co) film and a capping film over the cell region including the bit line contact; performing a primary rapid thermal annealing (RTA) process on the stack structure to allow cobalt (Co) atoms of the cobalt (Co) film to react with the bit line contact and form a cobalt silicide layer CoSix, where x is an integer.

The forming the ohmic contact layer includes removing a non-reactive cobalt (Co) film and the capping film; and performing a secondary RTA process on the cobalt silicide layer CoSix, where x is an integer.

The forming the bit line contact includes forming an insulation film over the semiconductor substrate; forming a bit line contact hole by etching an insulation film formed in the active region and between the gates; and forming a bit line contact by filling the bit line contact hole with a conductive material.

The ohmic contact layer includes a cobalt silicide layer CoSix where x is an integer.

The method further comprise before the formation of the bit line electrode, forming a line-type barrier film over the ohmic contact layer.

The method further comprises simultaneously patterning the bit line electrode and the barrier film.

The barrier film includes a titanium (Ti) film, a titanium nitride (TiN) film, or a stacked structure (Ti/TiN) of the titanium (Ti) film or the titanium nitride (TiN) film.

The forming the ohmic contact layer includes forming a first recess by partially etching the exposed bit line contact; and depositing a cobalt (Co) film in the first recess.

The method further comprise depositing a capping film over the cobalt (Co) film; performing a primary rapid thermal annealing (RTA) process on the deposited capping film and the cobalt film to form a cobalt silicide layer CoSix where x is an integer; removing a non-reactive cobalt (Co) film and the capping film to form a second recess exposing the cobalt silicide layer CoSix where x is an integer; and performing a secondary rapid thermal annealing (RTA) process on the cobalt silicide layer CoSix where x is an integer.

The method further comprises forming a barrier film in the second recess.

It is to be understood that both the foregoing general description and the following detailed description of embodiments are exemplary and explanatory but not limitative.

BRIEF DESCRIPTION OF THE DRAWINGS

FIGS. 5a to 5h are cross-sectional views illustrating a method for forming a semiconductor device according to the second embodiment.

DESCRIPTION OF EMBODIMENTS

Reference will now be made in detail to certain embodiments, examples of which are illustrated in the accompanying drawings. Wherever possible, the same reference numbers will be used throughout the drawings to refer to the same or like parts. In the following description, a detailed description of related known configurations or functions will be omitted.

Figure 1:
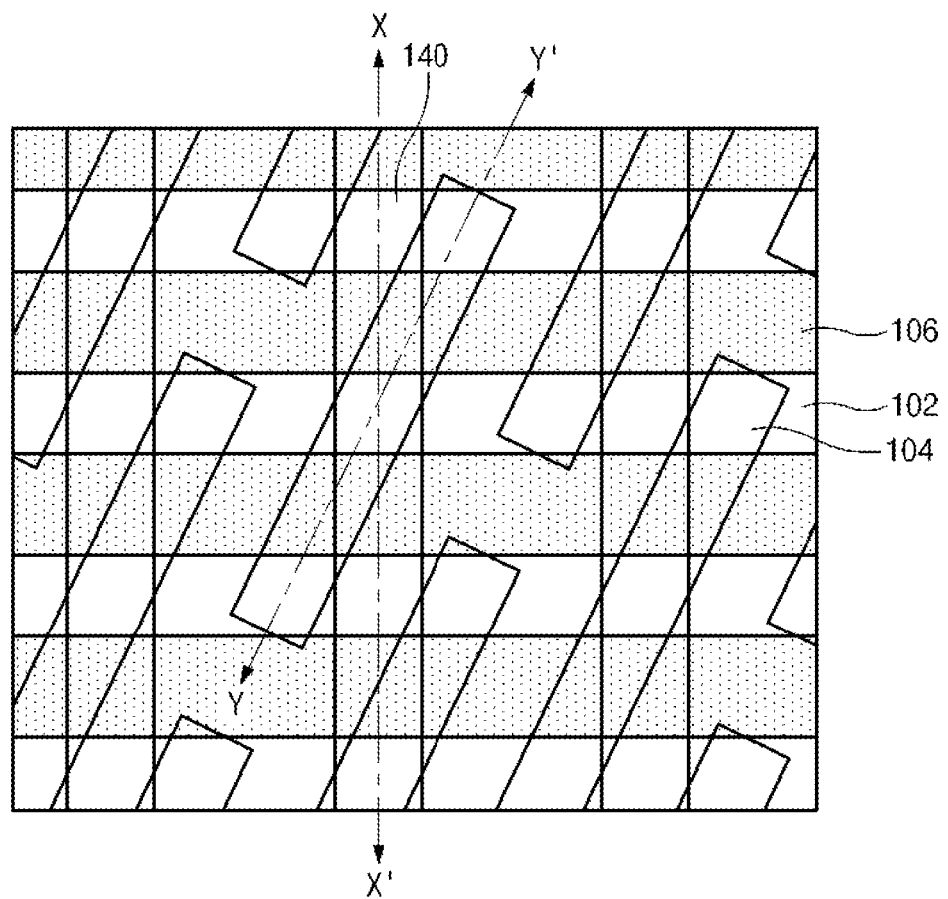
FIG. 1 is a plan view illustrating a semiconductor device according to an embodiment.
Figure 2A:
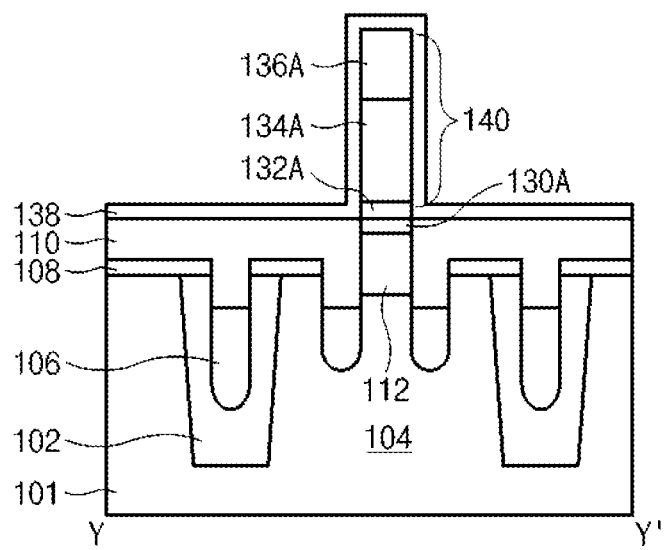
FIG. 2A is a cross-sectional view illustrating the semiconductor device taken along the line Y-Y' of FIG. 1 according to a first embodiment.
Figure 2B:
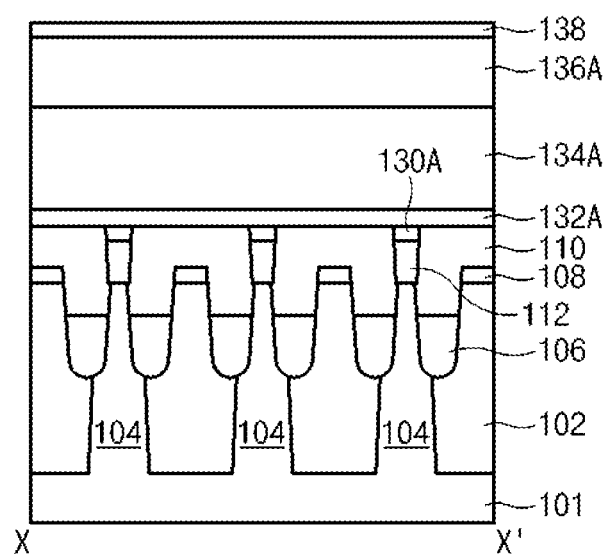
FIG. 2B is a cross-sectional view illustrating the semiconductor device taken along the line X-X' of FIG. 1 according to the first embodiment.
Figure 3A:
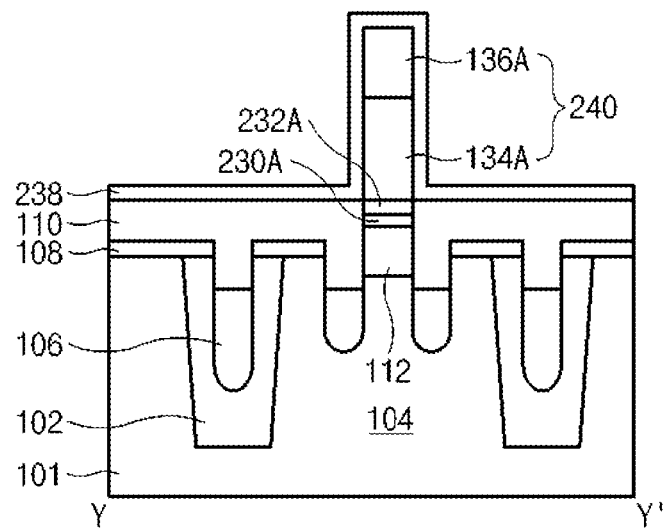
FIG. 3A is a cross-sectional view illustrating the semiconductor device taken along the line Y-Y' of FIG. 1 according to a second embodiment.
Figure 3B:
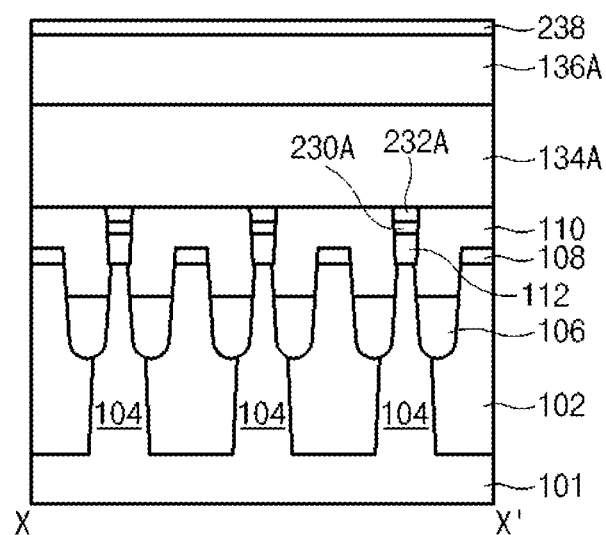
FIG. 3B is a cross-sectional view illustrating the semiconductor device taken along the line X-X' of FIG. 1 according to the second embodiment.

FIG. 1 is a plan view illustrating a semiconductor device according to an embodiment. FIGS. 2A-2B are cross-sectional views illustrating a semiconductor device according to a first embodiment. FIGS. 3A-3B are cross-sectional views illustrating a semiconductor device according to a second embodiment. In these figures, each of 2A and 3A is a cross-sectional view illustrating the semiconductor device taken along the line Y-Y' of FIG. 1, and each of 2B and 3B is a cross-sectional view illustrating the semiconductor device taken along the line X-X' of FIG. 1.

Referring to FIG. 1, the semiconductor device according to the embodiment includes an active region 104 defined by a device isolation film 102 in a semiconductor substrate, a two-line-shaped gate electrode 106 is formed to penetrate the active region 104, and a bit line structure 140 is formed perpendicular to the gate electrode 106.

The semiconductor device according to the first embodiment will hereinafter be described with reference to FIGS. 2A-2B. Referring to FIG. 2A illustrating a cross-sectional view of the semiconductor device taken along the line Y-Y', a buried gate 106 is formed in an active region 104 defined by a device isolation film 102 in a semiconductor substrate 101. Insulation films (108, 110) are formed over the semiconductor substrate 101. The insulation films (108, 110) formed over the buried gate 106 are etched to expose the active region 104 disposed between the buried gates 106 such that a bit line contact hole (not shown) is formed. Thereafter, a bit line contact 112 is formed to fill the bit line contact hole.

An ohmic contact layer 130A including a cobalt silicide material, $CoSi_x$ (wherein, x is an integer) is formed over the bit line contact 112. The ohmic contact layer 130A is formed between the insulation film 110 in the same manner as in the bit line contact 112. In this case, the bit line contact 112 and the ohmic contact layer 130A may serve as a bit line contact structure.

Thereafter, a barrier film 132A is formed over the ohmic contact layer 130A. A bit line structure 140 is formed over a barrier film 132A. The bit line structure 140 may be formed by sequentially depositing the barrier film 132A, a conductive layer 134A, and a hard mask film 136A. A spacer 138 is formed at an upper portion and sidewall of the bit line structure 140, and is also formed over the insulation film 110.

Referring to FIG. 2B illustrating a cross-sectional view of the semiconductor device taken along the line X-X' of FIG. 1, the ohmic contact layer 130A is formed over a bit line contact 112. The line-type barrier film 132A, the conductive layer 134A, and the hard mask film 136A are formed over the ohmic contact layer 130A.

In a semiconductor device according to the first embodiment, the ohmic contact layer 130A and the barrier film 132A are stacked between the bit line contact 112 and the conductive layer 134A for bit line formation. The ohmic contact layer 130A is formed between the insulation film 110 in the same manner as in the bit line contact 112. The barrier film 132A is formed as a line shape over the insulation film 110. As a result, the entire height of the bit line structure 140 is lower than that of a conventional bit line structure, resulting in reduction of bit line parasitic capacitance.

The semiconductor device according to a second embodiment will hereinafter be described with reference to FIGS. 3A-3B.

Referring to FIG. 3A illustrating a cross-sectional view of the semiconductor device taken along the line Y-Y', the semiconductor device according to the second embodiment includes a bit line structure 240 and a structure formed below the bit line structure 240 in a similar way to those of FIGS. 2A-2B illustrating the first embodiment. However, an ohmic contact layer 230A and a barrier film 232A are deposited over the bit line contact 112, and are filled between the insulation film 110.

Referring to FIG. 3B illustrating a cross-sectional view of the semiconductor device taken along the line X-X', the ohmic contact layer 230A is formed over the bit line contact 112, and the barrier film 232A is formed over the ohmic contact layer 230A. The line-shaped conductive layer 134A for forming a bit line electrode is formed over the barrier film 232A. The bit line contact 112, the ohmic contact layer 230A, and the barrier film 232A may serve as a bit line contact structure.

A spacer 238 is formed over an upper portion and sidewalls of the conductive layer 134A and the hard mask film 136A. The entire height of the bit line structure 240 corresponding to a stacked structure of the conductive layer 134A and the hard mask film 136A is greatly lower than the entire height of the conventional bit line structure, resulting in reduction of bit line parasitic capacitance. As described above, the bit line barrier film may be filled in the insulation film 110 so as to reduce the entire height of the bit line structures (240), such that parasitic capacitance between the bit line structure (240) and a storage node electrode can be minimized. In addition, the barrier films (232A) are continuously used, such that bit line contact interfacial resistance can also be reduced. FIGS. 4a-4o are cross-sectional views illustrating a method for forming a semiconductor device according to the first embodiment. In FIGS. 4a to 4o, each (i) is a cross-sectional view illustrating a cell region, and each (ii) is a cross-sectional view illustrating a peripheral region.

Referring to FIG. 4a, an insulation film 108 is formed over a semiconductor substrate 101 including an active region 104 defined by a device isolation film 102 of the cell region (i) of FIG. 4a. The insulation film 108 and a predetermined region of the semiconductor substrate 101 are etched to define a buried gate region (not shown). Subsequently, a gate electrode 106 is formed in the buried gate region (not shown). The gate electrode 106 is formed by filling the buried gate region with a conductive material. Subsequently, the gate electrode 106 is etched back, leaving the gate electrode 106 in a lower portion of the buried gate region. The gate electrode 106 may be formed of tungsten (W) having low resistance. Thereafter, a capping insulation film 110 is formed over the semiconductor substrate 101 including the etched-back gate electrode 106.

Referring to FIG. 4b, the capping insulation film 110 is selectively etched to expose the active region 104 disposed between the buried gates, such that a trench 103 is formed. A conductive material is formed over the entire surface including the trench 103, and a planarization process (such as CMP) is performed to expose the capping insulation film 110, resulting in formation of a bit line contact 112. In this case, the bit line contact 112 may be formed of polysilicon.

Figure 4C:
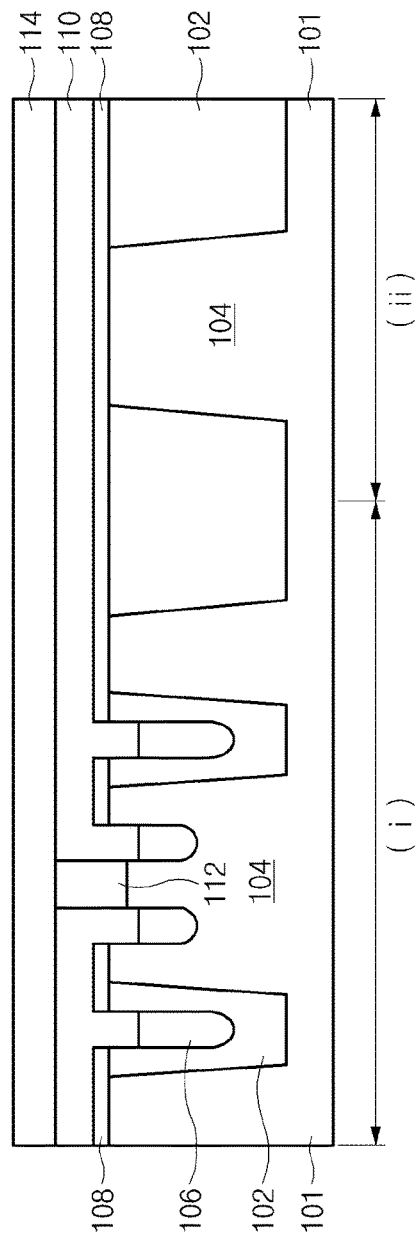
FIGS. 4a to 4o are cross-sectional views illustrating a method for forming a semiconductor device according to the first embodiment.

Referring to FIG. 4c, an insulation film 114 is formed over the entire surface including the cell region (i) of FIG. 4c and the peripheral region (ii) of FIG. 4c. In this case, the insulation film 114 may be formed of a nitride film.

Figure 4D:
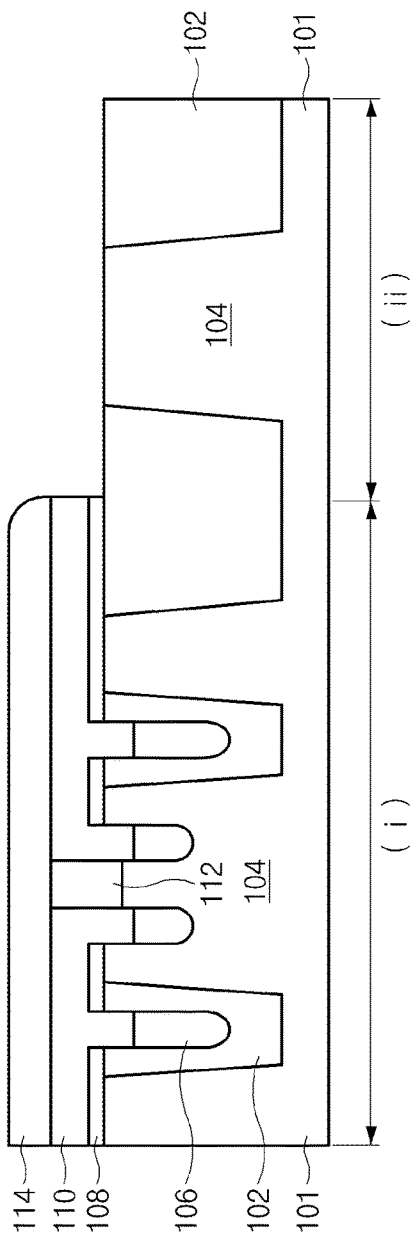

Referring to FIG. 4d, a photoresist film (not shown) covering the cell region of FIG. 4d (i) is formed using a peri open mask (POM) configured to open the peripheral region (ii) of FIG. 4d. The insulation film 114 and the capping insulation film 110 formed over the peripheral region (ii) of FIG. 4d are etched using the POM as an etch mask, such that the semiconductor substrate 101 of the peripheral region (ii) of FIG. 4d is exposed.

Figure 4E:
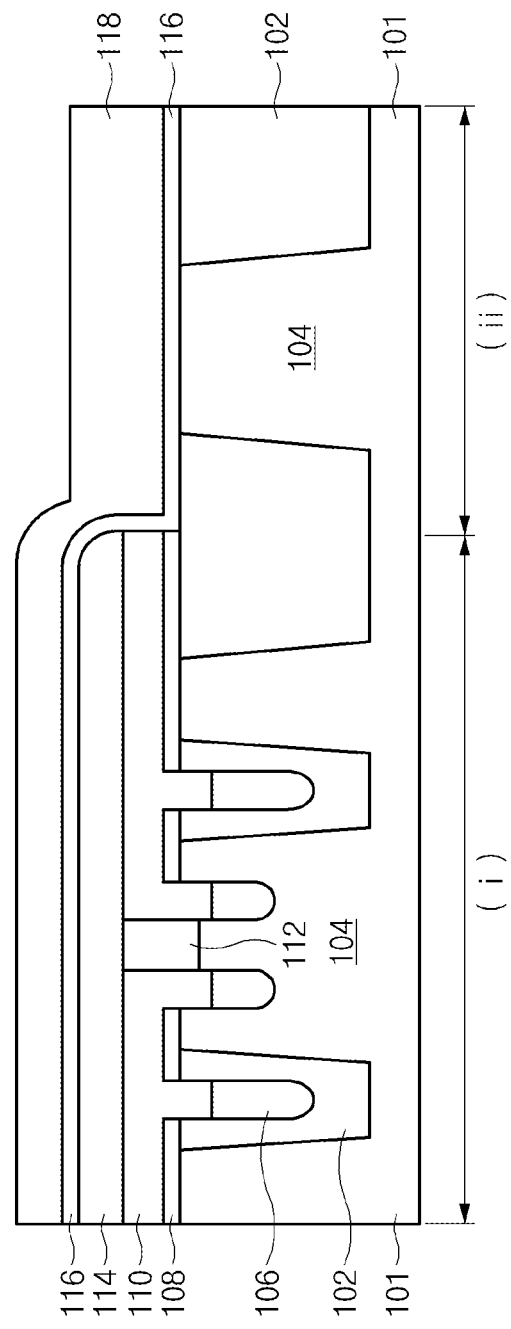

Referring to FIG. 4e, an insulation film 116 and a conductive layer 118 are formed over the entire surface including the cell region (i) of FIG. 4e and the peripheral region (ii) of FIG. 4e. In this case, the conductive layer 118 may include a polysilicon layer and may serve as a gate conductive material of the peripheral region (ii) of FIG. 4e. Preferably, the insulation film 116 may be formed of an oxide film. FIG. 4e shows an exemplary case in which the insulation films 116 are simultaneously formed in the cell region (i) of FIG. 4e and the peripheral region (ii) of FIG. 4e for convenience of description and better understanding. However, the insulation film may be first formed in the peripheral region (ii) of FIG. 4e and then formed in the cell region (i) of FIG. 4e as necessary.

Referring to FIG. 4f, an ion implantation process for forming a source/drain region is performed in the cell region (i) of FIG. 4f and the peripheral region (ii) of FIG. 4f. A barrier film 120 and a hard mask film 122 are sequentially stacked and deposited over the conductive layer 118 in the cell region (i) of FIG. 4f and the peripheral region (ii) of FIG. 4f. In this case, the barrier film 120 may include a titanium (Ti/TiN) film, etc., and the hard mask film 122 may include a nitride film.

Figure 4G:
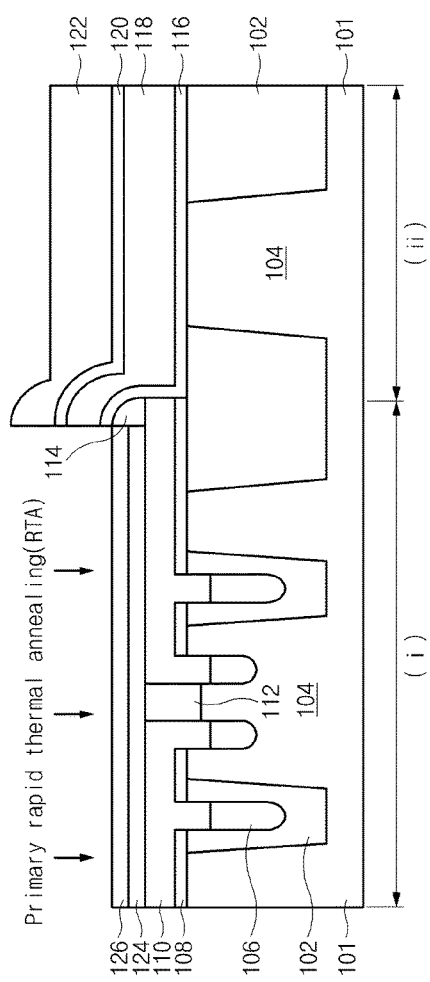

Referring to FIG. 4g, a photoresist film (not shown) is formed in the peripheral region (ii) of FIG. 4g using a cell open mask (COM) configured to open the cell region (i) of FIG. 4g. The hard mask film 122, the barrier film 120, the conductive layer 118, and the insulation films (116, 114) formed in the cell region (i) of 4g are removed using the COM as an etch mask, such that the bit line contact 112 is exposed.

Subsequently, a cobalt film 124 and a capping film 126 are sequentially deposited over the entire surface of the cell region (i) of FIG. 4g including the exposed bit line contact 112. In this case, the capping film 126 may be formed of titanium (Ti) or titanium nitride (TiN), or may be formed of a stacked structure (Ti/TiN) of the Ti film and the TiN film. The capping film 126 may prevent the cobalt (Co) film 124 from being oxidized by oxygen permeation during a subsequent thermal annealing process or chamber movement. The capping film 126 may be deposited to a thickness of 500 Å (angstrom) or less, for example, a thickness of 50 Å~500 Å.

Thereafter, a primary rapid thermal annealing (RTA) process is carried out. For example, the primary rapid thermal annealing (RTA) process may be performed at a temperature of 450° C.~650° C. during 60 seconds.

Figure 4H:
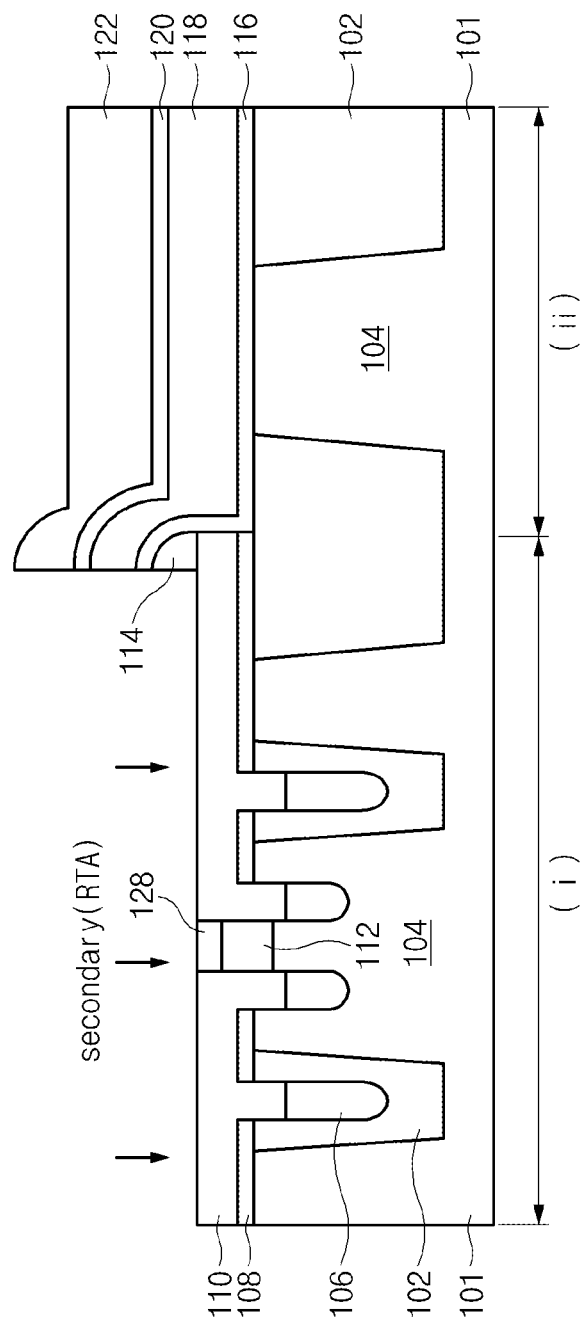

Referring to FIG. 4h, cobalt (Co) atoms of the cobalt (Co) film 124 are diffused into silicon grains of the bit line contact 112 by the primary rapid thermal annealing (RTA) process, such that a cobalt mono-silicide (CoSi) film 128 is formed. Since the primary rapid thermal annealing (RTA) process is a low-temperature fabrication process, the cobalt silicide $CoSi_x$ (wherein, x is an integer) has a CoSi phase in which the ratio of cobalt (Co) to silicon (Si) is 1:1. CoSi may also be referred to as cobalt mono-silicide (CoSi) 128 as necessary.

After formation of the cobalt mono-silicide (CoSi) film 128, a non-reactive cobalt film 124 and the capping film 126 are removed by wet etching. The wet etching may be performed using a mixture liquid of $H_2O_2$ and $H_2SO_4$.

Subsequently, a secondary rapid thermal annealing (RTA) process is carried out. The thermal annealing temperature of the secondary rapid thermal annealing (RTA) process is performed at a relatively higher temperature compared with the primary rapid thermal annealing (RTA) process. For example, the secondary rapid thermal annealing (RTA) process is carried out at a temperature of 700° C.~900° C. during 30 seconds.

For formation of cobalt silicide (CoSix) material, at least one rapid thermal annealing (RTA) process may be carried out. More preferably, the RTA process may be carried out in two steps.

Figure 4I:
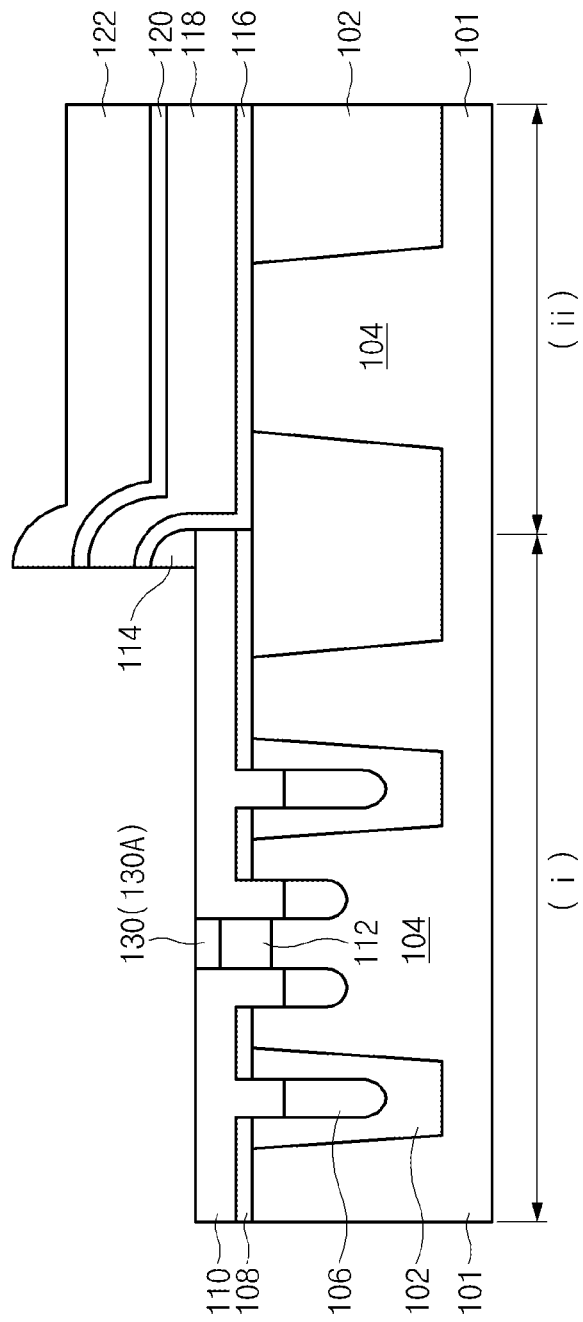

Referring to FIG. 4i, the secondary RTA process is performed at a high temperature, and the cobalt mono-silicide (CoSi) material is converted into the cobalt silicide (CoSix) material, e.g., a $CoSi_2$ material 130. The $CoSi_2$ material has low resistance and superior thermal stability. The $CoSi_2$ material 130 is more stable than the CoSi material 128, and has lower resistance than the CoSi material 128. In this case, the silicide material $CoSi_x$ (x is an integer) is used as the last ohmic contact layer 130A. Although the cobalt silicide material CoSi$_x$ (wherein, x is an integer) may be formed of a CoSi$_2$ material, the embodiment is not limited thereto.

Figure 4J:
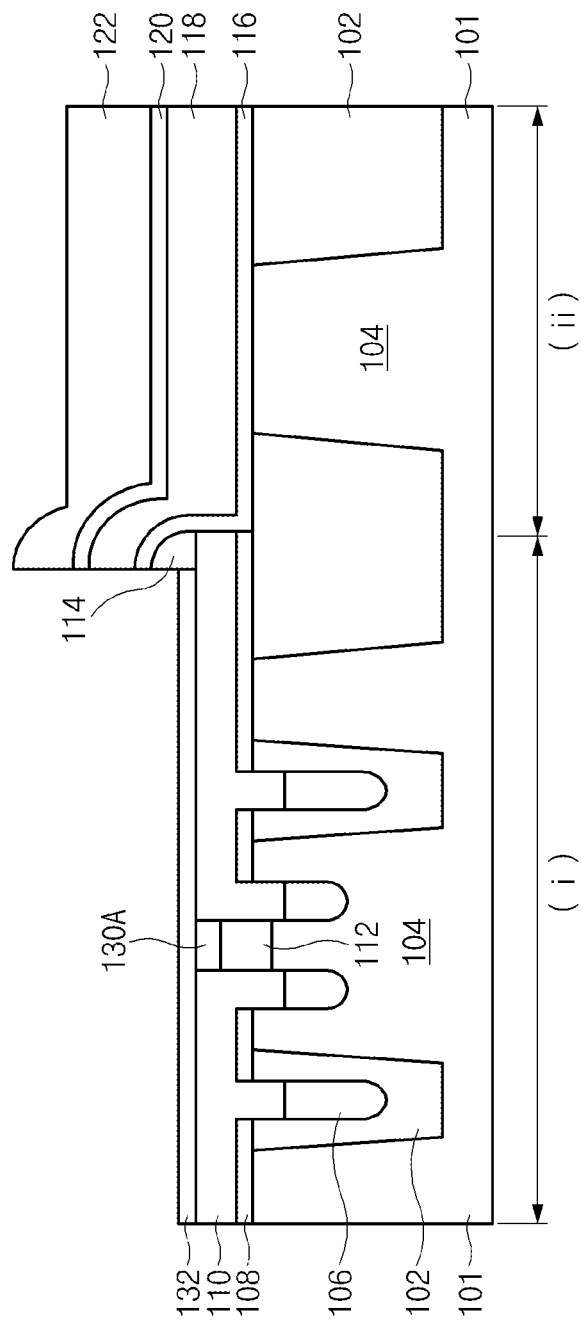

Referring to FIG. 4*j*, a barrier film 132 is formed over the entire surface of the cell region (i) of FIG. 4*j* including the ohmic contact layer 130A. In this case, the barrier film 132 may be formed of titanium (Ti) or titanium nitride (TiN), or may be formed of a stacked structure (Ti/TiN) of the Ti film and the TiN film. In addition, a fabrication process of the barrier film 132 may be omitted. If the fabrication process of the barrier film 132 is omitted, the entire height of the bit line structure is further reduced, resulting in reduction of bit line parasitic capacitance.

Figure 4K:
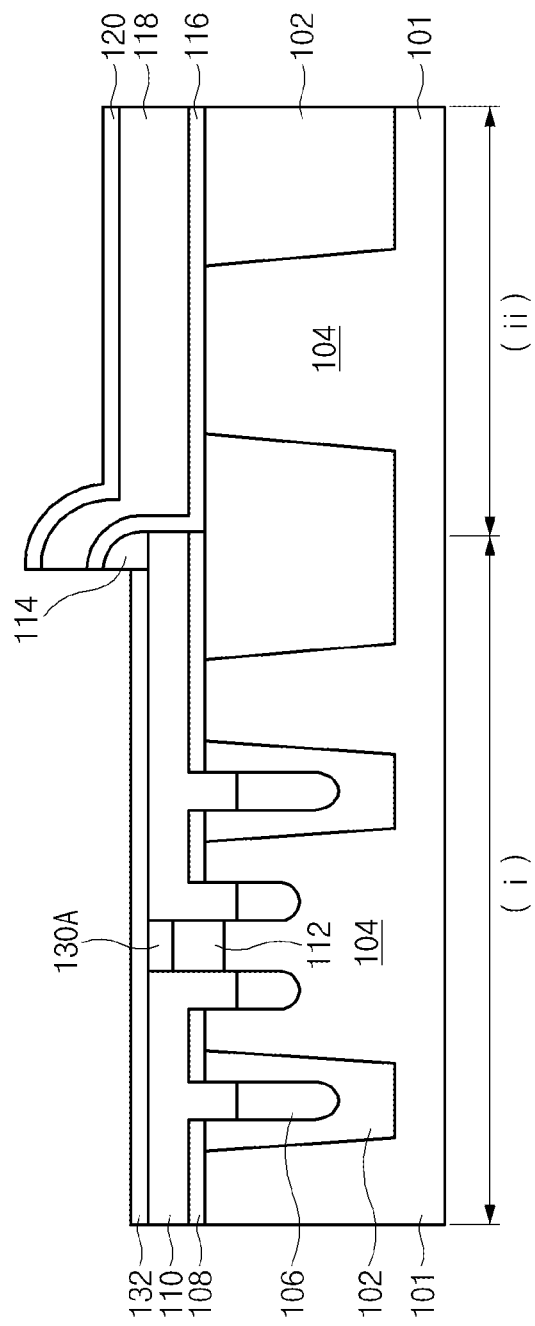
Figure 4I:
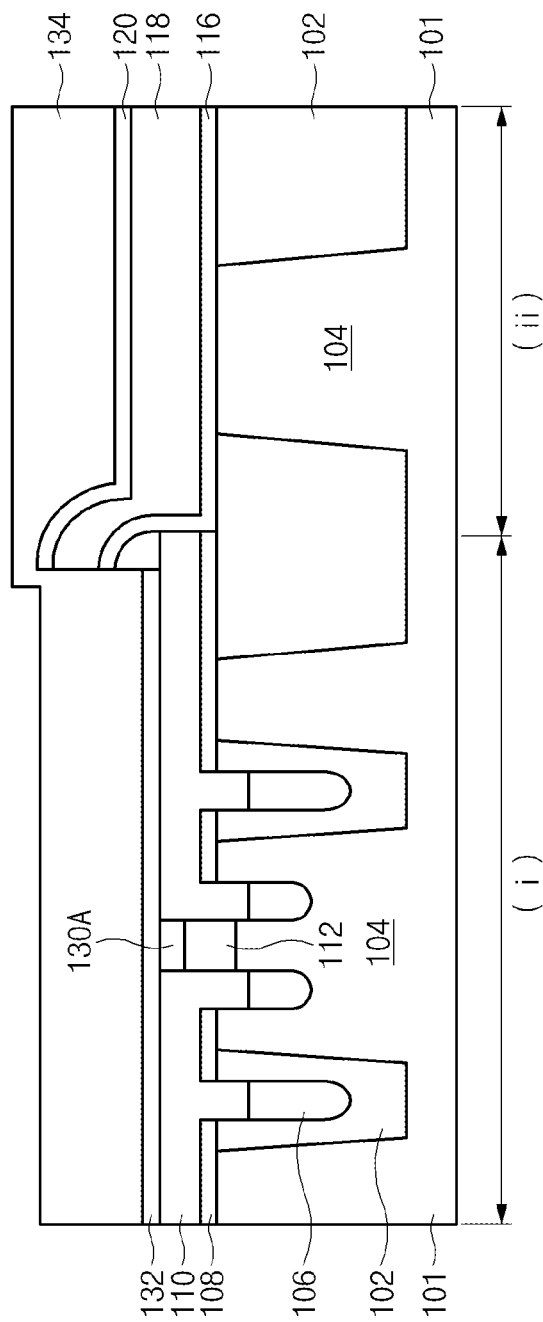

Referring to FIG. 4*k*, the hard mask film 122 of the peripheral region (ii) of FIG. 4*k* is removed using a mask configured to open the peripheral region (ii) of FIG. 4*k*.

Referring to FIG. 4*l*, a conductive layer 134 for formation of a bit line and a peri-gate electrode is deposited over the entire surface of the cell region (i) of FIG. 4*l* and the peripheral region (ii) of FIG. 4*l*. In this case, the conductive layer 134 for formation of a bit line and a peri-gate electrode may include tungsten (W).

Figure 4M:
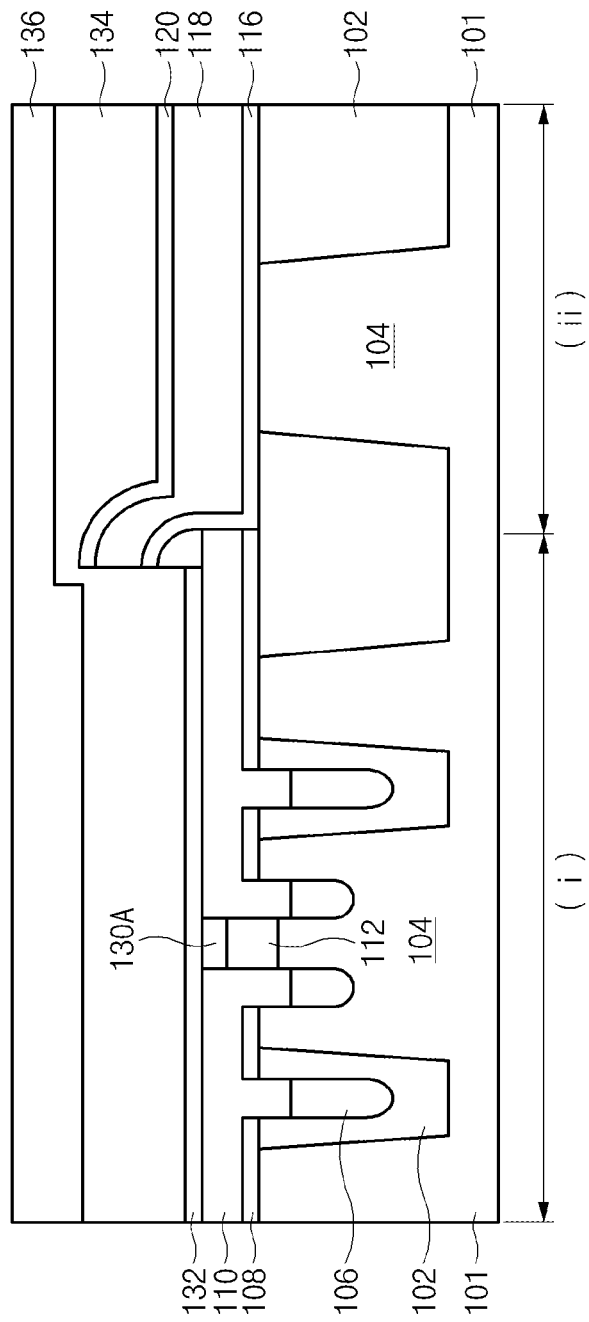

Referring to FIG. 4*m*, the insulation film 136 is deposited over the conductive layer 134 of the cell region (i) of FIG. 4*m* and the peripheral region (ii) of FIG. 4*m*. In this case, the insulation film 136 may include a nitride film.

Figure 4N:
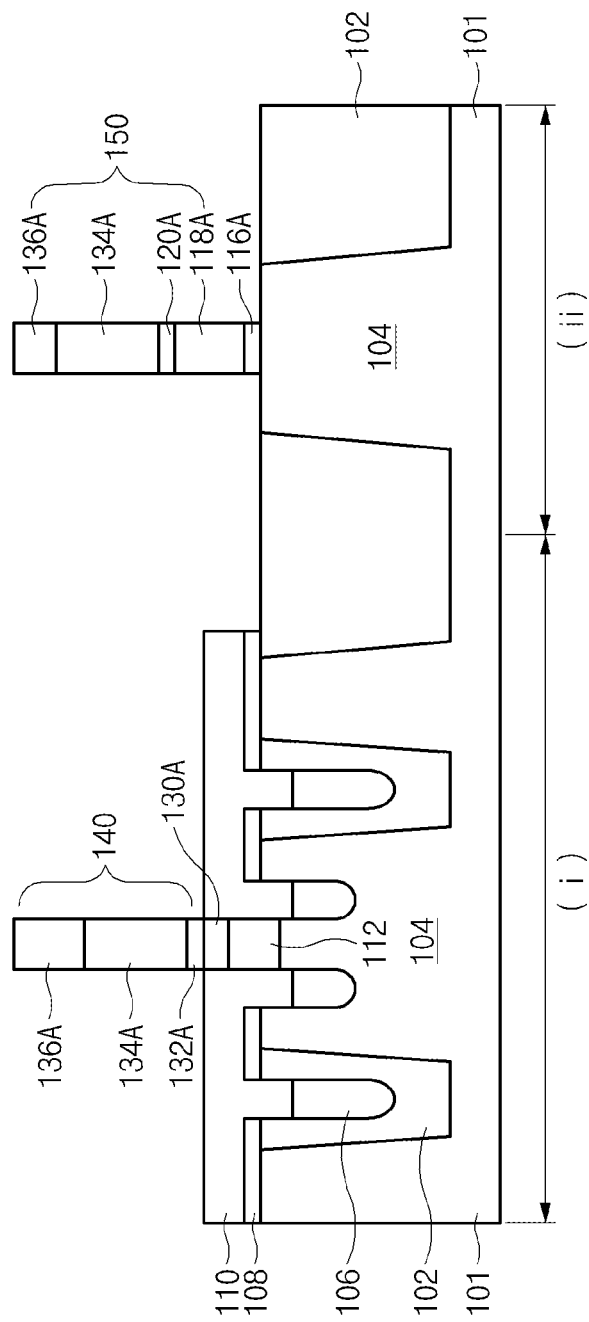
Figure 40:
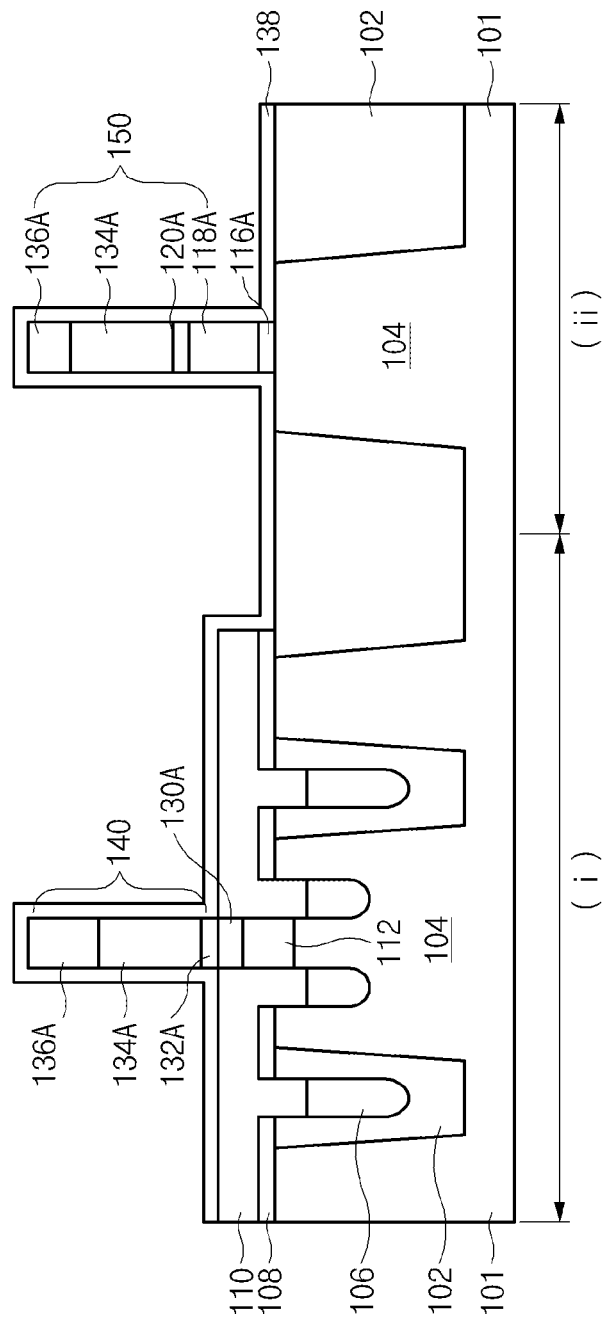

Thereafter, referring to FIG. 4*n*, in the cell region (i) of FIG. 4*n*, the insulation film 136, the conductive layer 134, and the barrier film 132 are etched using a bit line mask, such that a bit line structure 140 is formed by stacking the conductive layer 134A, the insulation film 136A, and the barrier film 132A. In the peripheral region (ii) of FIG. 4*n*, the insulation film 136, the conductive layer 134, the barrier film 120, the conductive layer 118, and the insulation film 116 are etched to form a gate structure 160 including a stack of the conductive layer 118A, the barrier film 120A, the conductive layer 134A, and the insulation film 136A, and also a gate insulation film 116A is formed.

Referring to FIG. 4*o*, a spacer 138 is formed in the cell region (i) of FIG. 4*o* including the bit line structure 140 and in the peripheral region (ii) of FIG. 4*o* including a gate structure 150. In this case, the spacer 138 is formed over sidewalls of the bit line structure 140 and sidewalls of the gate structure 150.

In accordance with the first embodiment, the ohmic contact layer 130A and the barrier film 132A are sequentially deposited over the bit line contact 112. Only the ohmic contact layer 130A is filled between the insulation film 110. The barrier film 132A is not buried between the insulation film 110. Instead, an upper portion and a sidewall of the barrier film 132 are exposed. Thereafter, the spacer 138A is formed at the sidewall of the barrier film 132A. Again, the barrier film 132A may be omitted as necessary.

FIG. 5*a*-5*h* are cross-sectional views illustrating a method for forming a semiconductor device according to the second embodiment. In FIGS. 5*a*-5*h*, each (i) is a cross-sectional view illustrating a cell region, and each (ii) is a cross-sectional view illustrating a peripheral region.

Figure 5A:
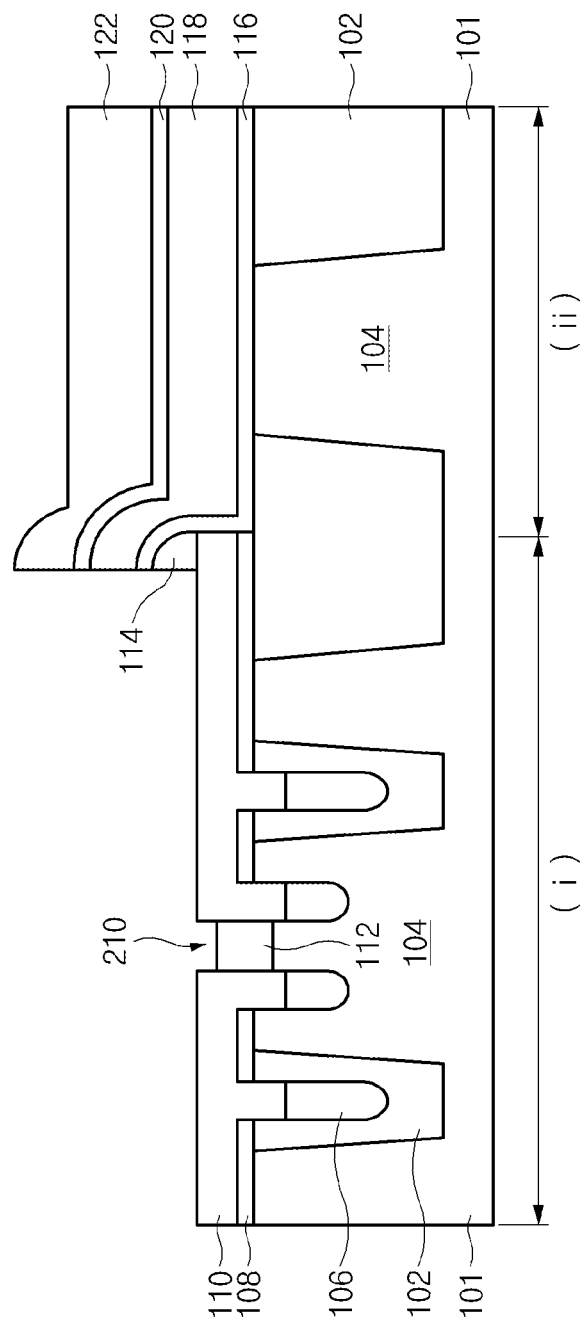

Upon completion of the same processes as those of FIGS. 4*a*-4*f*, a photoresist film (not shown) is formed in the peripheral region using a cell open mask (COM) opening the cell region as shown in FIG. 5*a*. The hard mask film 122, the barrier film 120, the conductive layer 118, and the insulation films (116, 114) formed over the cell region (i) FIG. 5*a* are removed using the COM as an etch mask, such that the bit line contact 112 is exposed. Thereafter, an upper portion of the bit line contact 112 is removed to form a recess 210. In this case, the material forming of the bit line contact 112, e.g., polysilicon, is different from the material forming of the insulation film 110 in a etch selection ratio, such that only an upper portion of the bit line contact 112 can be selectively etched through an etching process, resulting in formation of the recess 210.

Figure 5B:
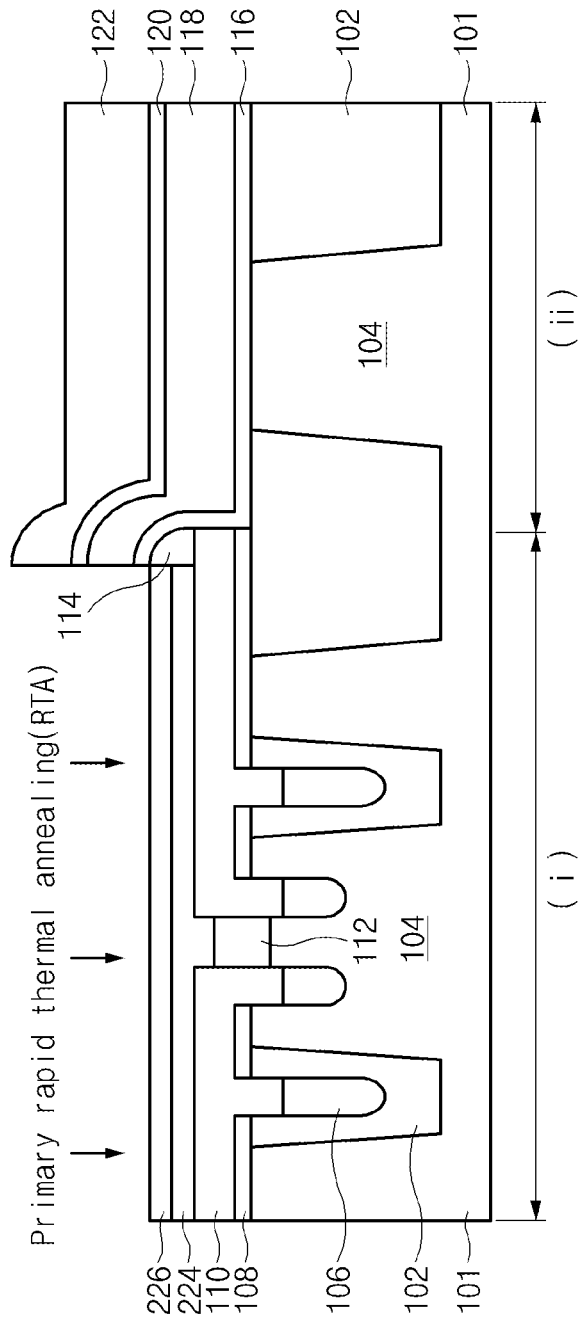

Referring to FIG. 5*b*, the cobalt (Co) film 224 and the capping film 226 are sequentially deposited over an entire surface of the cell region (i) including the recess 210. Here, the capping film 226 shown in the second embodiment may have the same material, thickness, function, and fabrication method as those of the capping film 126 shown in the first embodiment. Therefore, a detailed description thereof will herein be omitted for convenience of description. Thereafter, the primary rapid thermal annealing (RTA) process is carried out.

Figure 5C:
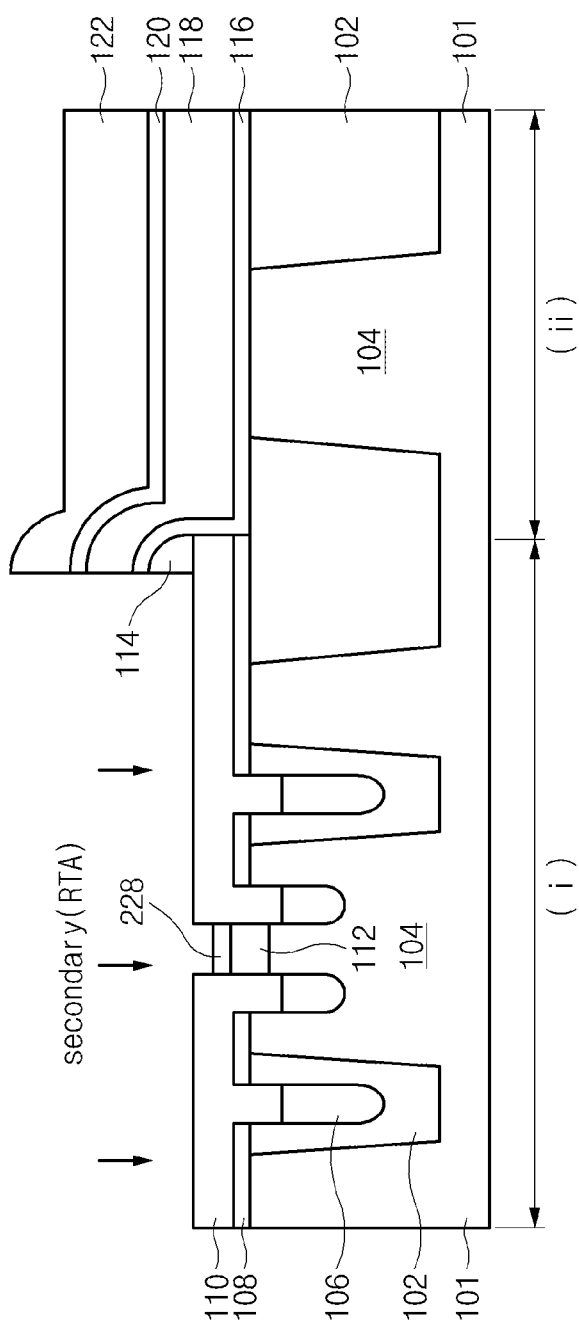

Subsequently, referring to FIG. 5*c*, cobalt (Co) atoms of the cobalt (Co) film 224 are diffused into silicon grains of the bit line contact 112 by the primary rapid thermal annealing (RTA) process, such that a cobalt mono-silicide (CoSi) film 228 is formed. Since the primary rapid thermal annealing (RTA) process is a low-temperature fabrication process, the cobalt silicide (CoSix) has a CoSi structure in which the ratio of cobalt (Co) to silicon (Si) is 1:1. CoSi may also be referred to as cobalt mono-silicide (CoSi) 128 as necessary. After formation of the cobalt mono-silicide (CoSi) film 128, a non-reactive cobalt film 224 and the capping film 226 are removed by wet etching. Upon removing the non-reactive cobalt film 224 and the capping film 226, a recess 212 is formed over the cobalt mono-silicide (CoSi) film 228. Subsequently, the secondary RTA process is carried out at a higher temperature than the primary RTA process.

Figure 5D:
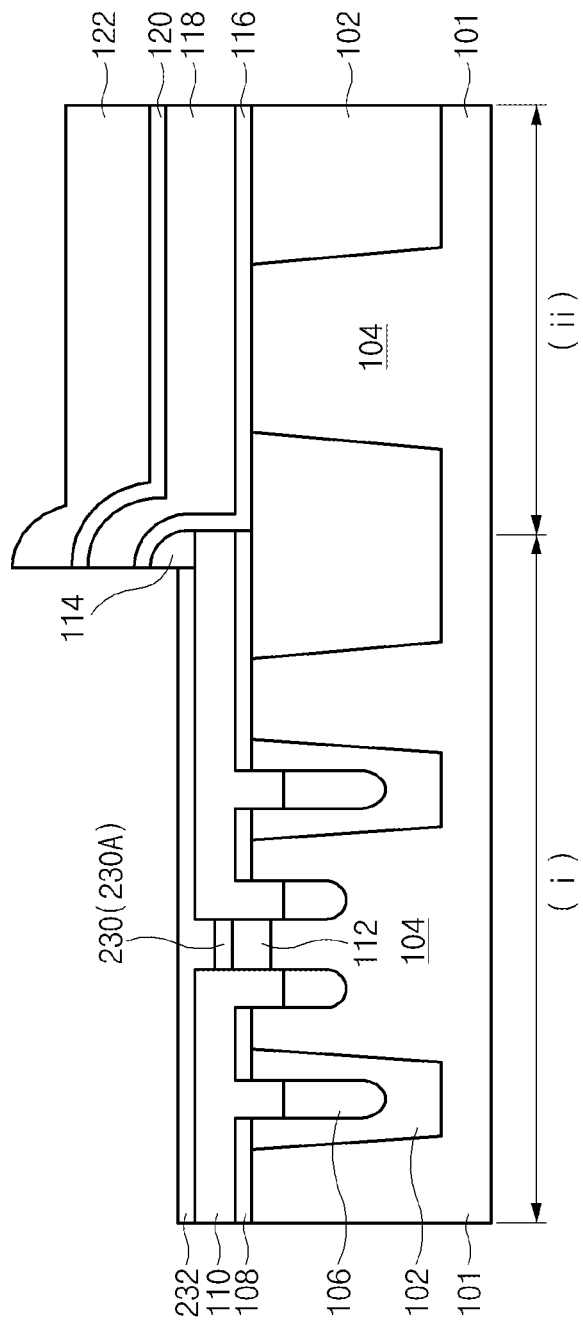

Referring to FIG. 5*d*, since the secondary RTA process is performed at a high temperature, the cobalt mono-silicide (CoSi) material is converted into a CoSi$_2$ material 230. The CoSi$_2$ structure has low resistance and superior thermal stability. The CoSi$_2$ layer 230 is also referred to as an ohmic contact layer 230A. Subsequently, a barrier film 232 is deposited over the entire surface of the cell region (i) of FIG. 5*d* including the ohmic contact layer 230A. In this case, the barrier film 232 may be formed of titanium (Ti) or titanium nitride (TiN), or may be formed of a stacked structure (Ti/TiN) of the Ti film and the TiN film.

Referring to FIG. 5*e*, the barrier film 232 is wet-etched with leaving the barrier film 232A in the recess 212. Thus, the barrier film 232 formed over the insulation film 110 is completely removed.

Figure 5F:
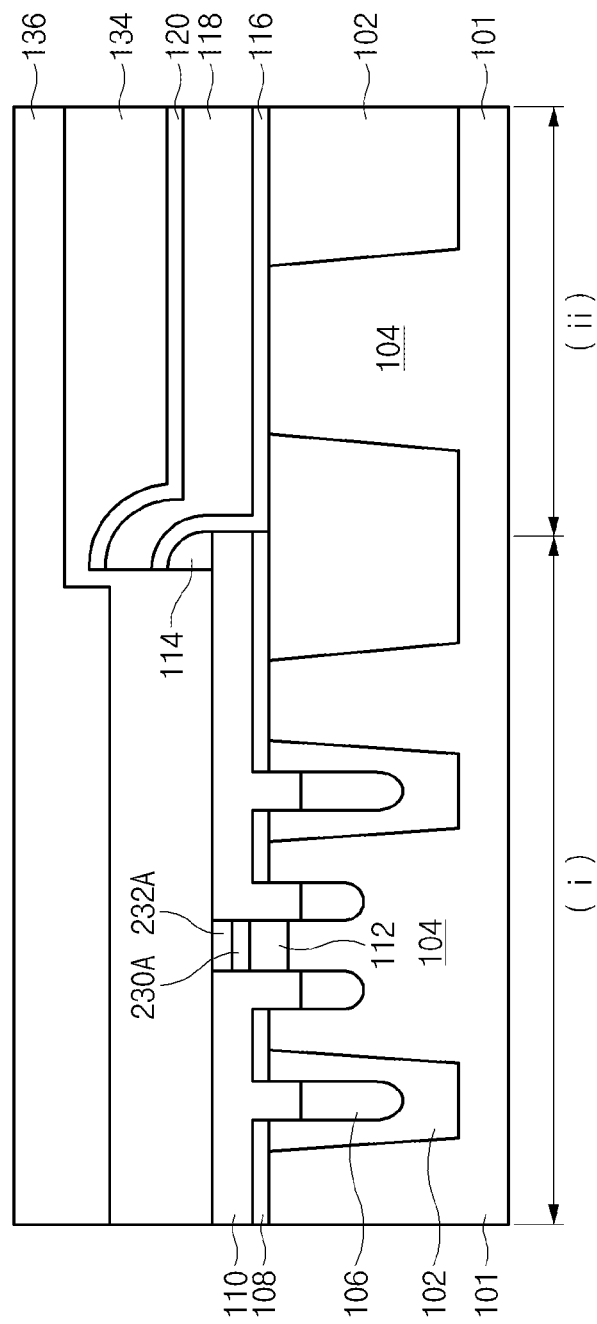

Referring to FIG. 5*f*, the hard mask film 122 of the peripheral region (ii) of FIG. 5*f* is removed using a mask configured to open the peripheral region (ii) of FIG. 5*f*. A conductive layer 134 and an insulation film 136 for formation of a bit line and a gate electrode are deposited over the entire surface of the cell region (i) and the peripheral region (ii). The conductive layer 134 for formation of a bit line and the gate electrode may include tungsten (W). The insulation film 136 may include a nitride film.

Figure 5G:
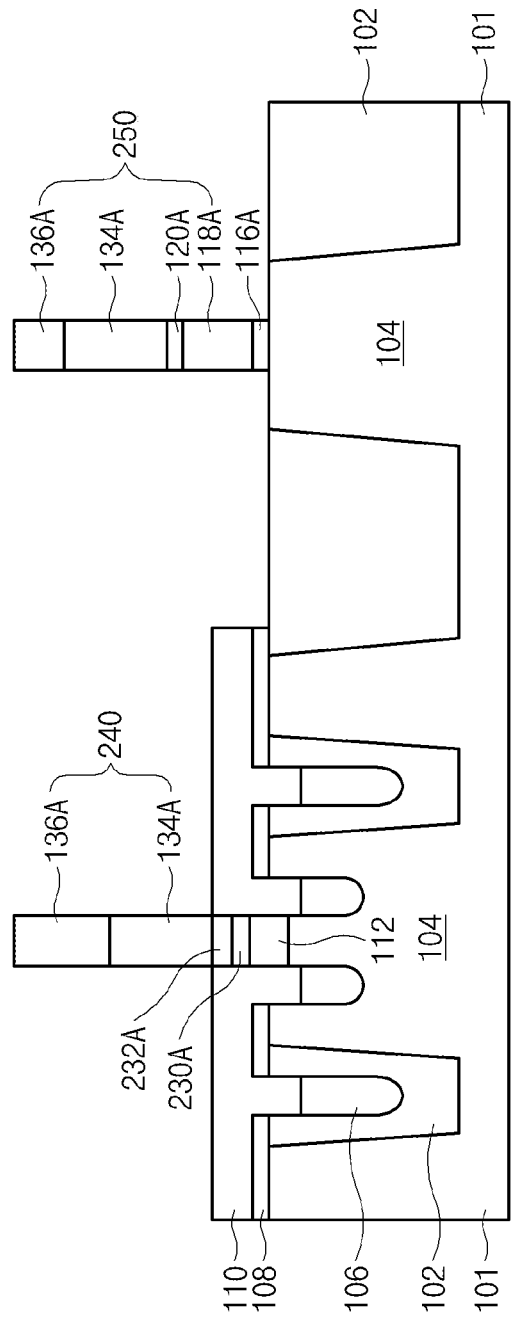

Referring to FIG. 5*g*, in the cell region (i) of FIG. 5*g*, the insulation film 136 and the conductive layer 134 are etched using a bit line mask, so that a bit line structure 140 is formed of a stack of the conductive layer 134A and the insulation film 136. In the peripheral region (ii), the insulation film 136, the conductive layer 134, the barrier film 120, the conductive layer 118, and the insulation film 116 are etched to form (i) a gate structure 250 formed of a stack of the conductive layer 118A, the barrier film 120A, the conductive layer 134A, and the insulation film 136A, and (ii) the gate insulation film 116A.

Figure 5H:
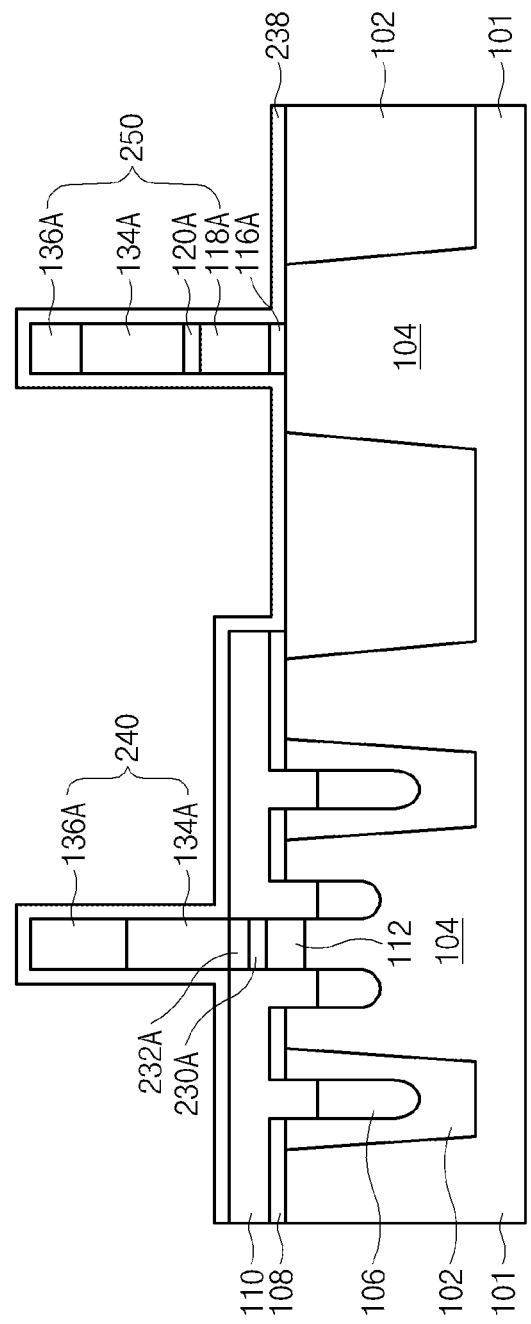

Referring to FIG. 5h, a spacer 238 is formed over the cell region (i) of FIG. 5h including the bit line structure 240 and over the peripheral region (ii) of FIG. 5h including a gate structure 250. In this case, the spacer 138 is formed over sidewalls of the bit line structure 240 and over sidewalls of the gate structure 250.

As described above, in accordance with the second embodiment, the ohmic contact layer 230A and the barrier film 232A are sequentially deposited over the bit line contact 112. The ohmic contact layer 230A and the barrier film 232A are filled between the insulation film 110.

Although the ohmic contact layer 230A is described as a $CoSi_2$ material, embodiments are not limited thereto. That is, various $CoSi_x$ materials (x is an integer) can be used as the ohmic contact layer 230A.

As is apparent from the above description, the semiconductor device and the method for forming the same according to the embodiments can maintain low bit line contact interfacial resistance. In addition, bit line parasitic capacitance can be minimized, resulting in improvement of semiconductor device characteristics.

The above embodiments are illustrative and not limitative. Various modifications are possible. The embodiments are not limited by the type of deposition, etching polishing, and patterning steps described herein. Nor are the embodiments limited to any specific type of semiconductor device. For example, the embodiments may be implemented in a volatile memory device such as a dynamic random access memory (DRAM) device or in non-volatile memory device.

What is claimed is:

1. A method for forming a semiconductor device comprising:
    forming a first gate and a second gate in an active region of a cell region;
    forming a bit line contact over the active region between the first gate and the second gate;
    forming a conductive material and a first barrier film over the bit line contact in the cell region and over a semiconductor substrate in a peripheral region;
    removing the conductive material and the first barrier film in the cell region to expose the bit line contact;
    forming an ohmic contact layer over the bit line contact; and
    forming a bit line electrode over the ohmic contact layer bit line contact structure.

2. The method according to claim 1, wherein the bit line electrode is formed in the cell region, and
    wherein the bit line electrode and a gate electrode in a peripheral region are formed in a same processing step.

3. The method according to claim 1, wherein forming the conductive material and the first barrier film includes:
    forming an insulation film over the bit line contact in the cell region and over the semiconductor substrate in the peripheral region;
    exposing the semiconductor substrate in the peripheral region by etching the insulation film in the peripheral region using a mask configured to open the peripheral region; and
    stacking the conductive material and the first barrier film over the semiconductor substrate in the peripheral region and over the insulation film in the cell region.

4. The method according to claim 1, wherein the forming the ohmic contact layer includes:
    forming a stack structure including a cobalt (Co) film and a capping film over the bit line contact;
    performing a primary rapid thermal annealing (RTA) process on the stack structure to allow cobalt (Co) atoms of the cobalt (Co) film to react with the bit line contact and form a cobalt silicide layer $CoSi_x$, where x is an integer.

5. The method according to claim 4, wherein the forming the ohmic contact layer includes:
    removing a non-reactive cobalt (Co) film and the capping film; and
    performing a secondary RTA process on the cobalt silicide layer $CoSi_x$, where x is an integer.

6. The method according to claim 1, wherein the forming the bit line contact includes:
    forming an insulation film over the active region;
    forming a bit line contact hole by etching the insulation film formed over the active region and between the first gate and the second gate; and
    forming a bit line contact by filling the bit line contact hole with a conductive material.

7. The method according to claim 1, wherein the ohmic contact layer includes a cobalt silicide layer $CoSi_x$ where x is an integer.

8. The method according to claim 1, further comprising:
    before the formation of the bit line electrode, forming a second barrier film over the ohmic contact layer.

9. The method according to claim 8, the method further comprising:
    simultaneously patterning the bit line electrode and the second barrier film.

10. The method according to claim 1, wherein the first barrier film includes a titanium (Ti) film, a titanium nitride (TiN) film, or a stacked structure (Ti/TiN) of the titanium (Ti) film and the titanium nitride (TiN) film.

11. The method according to claim 1, wherein the forming the ohmic contact layer includes:
    forming a first recess by partially etching the exposed bit line contact; and
    depositing a cobalt (Co) film in the first recess.

12. The method according to claim 11, the method further comprising:
    depositing a capping film over the cobalt (Co) film;
    performing a primary rapid thermal annealing (RTA) process on the deposited capping film and the cobalt film to form a cobalt silicide layer $CoSi_x$ where x is an integer;
    removing a non-reactive cobalt (Co) film and the capping film to form a second recess exposing the cobalt silicide layer $CoSi_x$ where x is an integer; and
    performing a secondary rapid thermal annealing (RTA) process on the cobalt silicide layer $CoSi_x$ where x is an integer.

13. The method according to claim 12, the method further comprising:
    forming a barrier film in the second recess.

14. A method for forming a semiconductor device comprising:
    forming a gate in a semiconductor substrate of a cell region including an active region defined by a device isolation film;
    forming a bit line contact structure over the semiconductor substrate in an active region and between the gate and a neighboring gate, wherein the bit line contact structure includes a stack of a bit line contact and an ohmic contact layer; and
    forming a bit line electrode over the bit line contact structure,
    wherein the forming the bit line contact structure includes:

forming a conductive material and a barrier film over the bit line contact in the cell region and over the semiconductor substrate in a peripheral region;

removing the conductive material and a barrier film in the cell region to expose the bit line contact; and forming an ohmic contact layer over the bit line contact, and wherein the forming the ohmic contact layer includes:

forming a first recess by partially etching the exposed bit line contact; and depositing a cobalt (Co) film in the first recess.

15. The method according to claim 14, the method further comprising:

forming a barrier film in the second recess.

* * * * *